US012660322B2

(12) United States Patent
Wang et al.

(10) Patent No.: US 12,660,322 B2
(45) Date of Patent: Jun. 16, 2026

(54) DISPLAY PANEL AND DISPLAY DEVICE

(71) Applicants: Beijing BOE Optoelectronics Technology Co., Ltd., Beijing (CN); BOE TECHNOLOGY GROUP CO., LTD., Beijing (CN)

(72) Inventors: Desheng Wang, Beijing (CN); Zhichao Yang, Beijing (CN); Yong Zhang, Beijing (CN); Jian Wang, Beijing (CN); Qi Deng, Beijing (CN); Lingfang Nie, Beijing (CN); Longhu Hao, Beijing (CN); Zanwu Guo, Beijing (CN); Hui Li, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 390 days.

(21) Appl. No.: 18/579,403

(22) PCT Filed: Dec. 26, 2022

(86) PCT No.: PCT/CN2022/142019
§ 371 (c)(1),
(2) Date: Jan. 15, 2024

(87) PCT Pub. No.: WO2024/138319
PCT Pub. Date: Jul. 4, 2024

(65) Prior Publication Data
US 2025/0089370 A1     Mar. 13, 2025

(51) Int. Cl.
H10D 86/60     (2025.01)
H10D 86/40     (2025.01)

(52) U.S. Cl.
CPC ........... H10D 86/60 (2025.01); H10D 86/443 (2025.01)

(58) Field of Classification Search
CPC ...... H10D 86/60; H10D 86/443; H10D 86/00; G02F 1/133; G09F 9/30; G09G 3/36
See application file for complete search history.

(56) References Cited

U.S. PATENT DOCUMENTS

2009/0195721 A1     8/2009     Tanahara
2015/0212261 A1*    7/2015     Masuda ................. H04N 5/645
                                                              348/794
(Continued)

FOREIGN PATENT DOCUMENTS

CN          104332132 A     2/2015
CN          205158884 U     4/2016
(Continued)

*Primary Examiner* — Mekonnen D Dagnew
(74) *Attorney, Agent, or Firm* — HOUTTEMAN LAW LLC

(57) ABSTRACT

The present disclosure provides a display panel, including a display area and a bezel area surrounding the display area, edge lines of the display area and the bezel area are arc edge lines and matched with each other in shape, the display panel includes a peripheral circuit and peripheral signal lines, which are distributed in the bezel area, and further includes an array substrate and a color filter substrate, which are not overlapped at edges thereof on a first side, and in a portion of the bezel area where the edges on the first side are not located, a distance between the peripheral signal line, closest to an outer edge of the bezel area, and the outer edge of the bezel area is in a range of 0.35±0.2 micrometers, the outer edge of the bezel area is an edge of the bezel area away from the display area.

20 Claims, 13 Drawing Sheets

(56) References Cited

U.S. PATENT DOCUMENTS

| | | |
|---|---|---|
| 2017/0123572 A1 | 5/2017 | Song et al. |
| 2021/0096415 A1* | 4/2021 | Zhou .................. G02F 1/13452 |
| 2021/0343256 A1 | 11/2021 | Ishige |

FOREIGN PATENT DOCUMENTS

| | | |
|---|---|---|
| CN | 108254984 A | 7/2018 |
| CN | 108389516 A | 8/2018 |
| CN | 110088715 A | 8/2019 |
| CN | 111650788 A | 9/2020 |
| CN | 112435593 A | 3/2021 |
| CN | 113341600 A | 9/2021 |
| CN | 110596979 B | 7/2022 |
| CN | 114967272 A | 8/2022 |
| KR | 20120133849 A | 12/2012 |

* cited by examiner

B

D

F (107)

E (107)

DISPLAY PANEL AND DISPLAY DEVICE

TECHNICAL FIELD

The present disclosure relates to the field of display technology, and particularly relates to a display panel and a display device.

BACKGROUND

With the increasing demand of the modern society for circular display products, the design of the circular display products becomes an important part in the design of liquid crystal display products, but with the requirement of the circular display products for narrower and narrower bezels, the requirements of the circular display products for narrow bezels and for sufficient spaces for designs in the bezels are desired to be satisfied simultaneously. The requirements for the narrow bezels and for the sufficient spaces for the designs in the bezels expect to optimally design circuit arrangements in bezel areas of the circular display products. In addition, a design in the bezel areas of the circular display products is desired to save space as much as possible, so as to minimize the bezels of the circular display products.

SUMMARY

In a first aspect, the present disclosure provides a display panel having a display area and a bezel area, with the bezel area being disposed around the display area, an edge line of the display area being a circular arc edge line, an edge line of the bezel area being a circular arc edge line, and the edge line of the display area being matched with the edge line of the bezel area in shape, the display panel includes a peripheral circuit and peripheral signal lines, the peripheral circuit and the peripheral signal lines are distributed in the bezel area, and the peripheral circuit and the peripheral signal lines are sequentially distributed in a direction away from the display area, the display panel further includes an array substrate and a color filter substrate, and the array substrate and the color filter substrate are aligned and combined opposite to each other to form a cell, the array substrate and the color filter substrate are not overlapped at edges thereof on a first side, in a portion of the bezel area where the edges on the first side are not located, a distance between the peripheral signal line closest to an outer edge of the bezel area and the outer edge of the bezel area is in a range of 0.35±0.2 micrometers, and the outer edge of the bezel area is an edge of the bezel area away from the display area.

In some implementations, the display area is circular, the display area is located in an area where orthographic projections of the array substrate and the color filter substrate are overlapped, the bezel area includes a first part located on a second side of the array substrate and the color filter substrate which are aligned and combined opposite to each other, and the second side is opposite to the first side, an edge line of the first part is a semicircular arc edge line, and a circle center of the semicircular arc edge line of the first part is in coincidence with a circle center of a semicircular arc edge line of the display area on the second side.

In some implementations, the first part includes a first sub-part and a second sub-part, the first sub-part is located on a side of the display area away from the first side, the second sub-part is divided to be arranged on two opposite side edges of the display area along a second direction, the first side and the second side of the array substrate and the color filter substrate which are aligned and combined opposite to each other are arranged along a first direction, the second direction is perpendicular to the first direction, the peripheral circuit includes a shift register circuit, and the peripheral signal lines include a first signal line connected to the shift register circuit, neither the shift register circuit nor the first signal line is distributed in the first sub-part, a part of the shift register circuit and a part of the first signal line are distributed in the second sub-part, and total widths of an area, occupied by a distribution of the shift register circuit and the first signal line, at arbitrary positions in the second sub-part are equal.

In some implementations, a width of the first part is in a range from 1.0 mm to 2.7 mm.

In some implementations, the bezel area further includes a second part and a third part, the second part and the third part are located on the first side of the array substrate and the color filter substrate which are aligned and combined opposite to each other, and the second part and the third part are sequentially arranged away from the first part along the first direction, the second part is divided to be arranged on the two opposite side edges of the display area along the second direction, the third part is located at the edge of the display area on the first side, the peripheral signal lines further include a data line, the data line, a part of the shift register circuit and a part of the first signal line are distributed in the second part and the third part, the data line and the shift register circuit are sequentially distributed away from the display area, and total widths of an area, occupied by a distribution of the shift register circuit and the first signal line, at arbitrary positions in the second part are equal.

In some implementations, a distribution width of the data line in the second part gradually increases from an end of the second part close to the first part to an end of the second part close to the third part.

In some implementations, the distribution width of the data line in the second part and the third part gradually increases from the second part to the third part.

In some implementations, a width of the second part gradually increases along a direction from the second part to the third part.

In some implementations, the width of the second part is in a range from 1.5 mm to 3.2 mm.

In some implementations, the peripheral circuit further includes a driving circuit, a bonding connection terminal, an electrostatic discharge circuit, and a shielding grounded electrode, the peripheral signal lines further include a test signal line group, a common voltage signal line and a shielding signal line, the driving circuit, the bonding connection terminal, the electrostatic discharge circuit, the shielding grounded electrode and the test signal line group are distributed in the third part, the bonding connection terminal and the test signal line group are respectively connected with the driving circuit, the shielding signal line is connected with the shielding grounded electrode and the bonding connection terminal, the common voltage signal line is connected with the shift register circuit and the electrostatic discharge circuit, the shielding signal line and the common voltage signal line extend from the third part to the second part and the first part respectively, and the shielding signal line and the common voltage signal line each loop around the display area, the common voltage signal line is located in an area between the display area and the shift register circuit, the peripheral circuit and the peripheral signal lines, other than the common voltage signal line, distributed in the bezel area are located in an area between the shielding signal line and the display area.

In some implementations, a width of the third part in the second direction gradually decreases in a direction in which the third part is away from the second part.

In some implementations, the bonding connection terminal is located on a side of the driving circuit away from the display area, the data line distributed in the third part is located on a side of the driving circuit close to the display area, the electrostatic discharge circuit is located on two opposite sides of an area, where the data line is distributed, along the second direction, the shielding grounded electrode is located on at least one side of the driving circuit along the second direction, and the shielding grounded electrode is located on a side of the shift register circuit away from the display area, data lines in the third part are distributed in a fan shape or an inverted trapezoid shape, and the third part is in a fan shape or an inverted trapezoid shape.

In some implementations, the third part has a width along the second direction in a range from 10 mm to 12 mm.

In some implementations, a width of the third part in the direction away from the display area is in a range from 3.0 mm to 3.5 mm.

In some implementations, the bonding connection terminal includes a plurality of terminals, and the plurality of terminals are sequentially arranged at intervals along the second direction, with first and last terminals being grounded, an end of the shielding signal line is connected with the first terminal so that the shielding signal line extends to be connected with the shielding grounded electrode, and the shielding grounded electrode extends to loop around the shift register circuit on a side of the shift register circuit away from the display area, another end of the shielding signal line is connected with the last terminal.

In some implementations, the bonding connection terminal includes a plurality of terminals, and the plurality of terminals are sequentially arranged at intervals along the second direction, with first and last terminals being grounded, an end of the shielding signal line is connected with the first terminal so that the shielding signal line extends to an outer side of the shift register circuit away from the display area and an inner side of the shielding grounded electrode close to the display area, the shielding signal line is connected with the shielding grounded electrode, and the shielding grounded electrode extends into the second part and the first part to loop around the shift register circuit on the outer side of the shift register circuit away from the display area, another end of the shielding signal line is connected with the last terminal.

In some implementations, the peripheral circuit and the peripheral signal line are formed on the array substrate, an orthographic projection of the color filter substrate on the array substrate is not overlapped with the driving circuit and the bonding connection terminal, an orthographic projection of an edge line of the color filter substrate, on the first side, on the array substrate is located on the array substrate, and is partially overlapped with the shielding grounded electrode, an electrostatic discharge electrode is arranged on a surface of the color filter substrate away from the array substrate, corresponds to the shielding grounded electrode in position, and is connected with the shielding grounded electrode through a conductive adhesive which extends to be partially wrapped on an end surface at the edge of the color filter substrate on the first side.

In some implementations, a dimension of the color filter substrate along the first direction is less than a dimension of the array substrate along the first direction, the driving circuit, the bonding connection terminal, the test signal line group, a part of the data line and a part of the shielding grounded electrode are exposed outside the edge line of the color filter substrate on the first side.

In some implementations, the display area is circular, the display area is located in an area where orthographic projections of the array substrate and the color filter substrate are overlapped, the bezel area includes a first part located in the area where the orthographic projections of the array substrate and the color filter substrate are overlapped, an edge line of the first part is an unclosed circular arc edge line, and a circle center of the unclosed circular arc edge line is in coincidence with a circle center of a circular arc edge line of the display area.

In some implementations, the bezel area further includes a second part located at edges of the array substrate and the color filter substrate, which are aligned and combined opposite to each other, on the first side, the second part is in a fan shape or an inverted trapezoid shape, a width of the second part in the direction away from the display area is greater than a width of the first part in the direction away from the display area.

In some implementations, the width of the first part is in a range from 1.2 mm to 3.5 mm.

In some implementations, a width of the second part along a direction in which the edges on the first side extend is in a range from 8 mm to 15 mm.

In some implementations, the width of the second part in the direction away from the display area is in a range of 3.0 mm to 5.5 mm.

In a second aspect, the present disclosure further provides a display device including the display panel described above.

DESCRIPTION OF DRAWINGS

The accompanying drawings are included to provide a further understanding of the present disclosure, and are incorporated in and constitute a part of this specification, illustrate embodiments of the present disclosure and together with the description serve to explain the principles of the present disclosure but not to limit the present disclosure. The above and other features and advantages will become more apparent to those skilled in the art by describing in detail exemplary embodiments with reference to the accompanying drawings.

DETAILED DESCRIPTION

Figure 1:
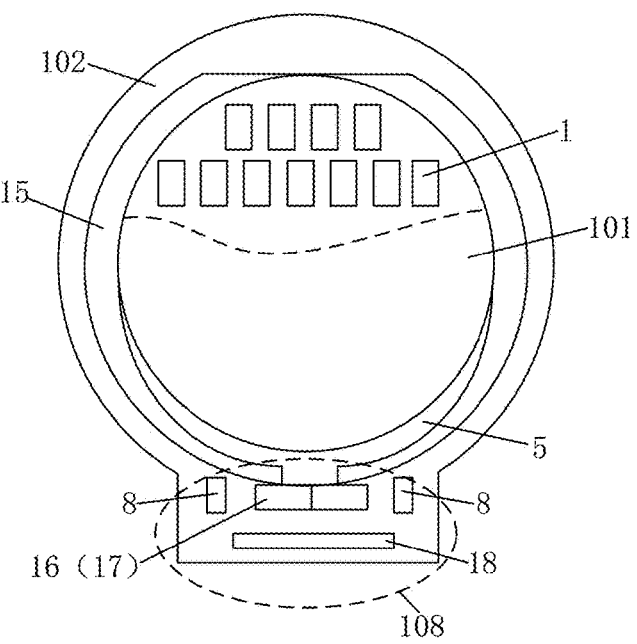
FIG. 1 is a schematic top view illustrating a structure of a circular display panel according to the related art.

In order to enable those skilled in the art to better understand technical solutions of the present disclosure, a display panel and a display device provided in the present disclosure are described in further detail below with reference to the accompanying drawings.

The embodiments of the present disclosure will be described more fully hereinafter with reference to the accompanying drawings, but the embodiments may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but include modifications of configurations formed based on a manufacturing process. Thus, areas illustrated in the figures have schematic properties, and shapes of the areas shown in the figures illustrate specific shapes of the areas, but are not intended to be limiting.

FIG. 1 is a schematic top view illustrating a structure of a circular display panel according to the related art, and referring to FIG. 1, the display panel includes a circular display area 101 and a bezel area 102 surrounding the display area 101, pixels 1 in an array are arranged in the display area 101, peripheral driving circuits (such as a GOA circuit 15, a gate driving chip 16, a data driving chip 17, an electrostatic discharge circuit 8, a bonding connection circuit 18 and the like) for driving the pixels 1 to perform displaying and peripheral wirings (such as a data line 5, an electrostatic shielding line, a signal line connected with the GOA circuit 15, a test signal line and the like) are arranged in the bezel area 102, and the GOA circuit 15 is distributed around the display area 101 and configured to provide scanning driving signals for driving the pixels to perform displaying. A gate driving chip (Gate IC) 16 and a data driving chip (Data IC) 17 are distributed in a bonding side bezel area 108 of the display panel, and the gate driving chip 16 is configured to provide a driving signal for the GOA circuit 15, the data driving chip 17 is configured to provide a data signal for the data line, and the gate driving chip 16 and the data driving chip 17 are configured to provide driving signals for driving the pixels 1 to perform displaying. The electrostatic discharge circuit 8 is disposed in the bonding side bezel area 108, and is configured to discharge static electricity of some signal lines and some nodes in the peripheral driving circuits (such as the GOA circuit) and pixel circuits in the display area 101. The bonding connection circuit 18 is disposed in the bonding side bezel area 108 to be bonded and connected with a peripheral circuit board, so that the peripheral circuit board provides display signals to the peripheral driving circuits.

In the related art, the bezel area 102 and the display area 101 are concentric circles having a same center, which results in that a width of the bezel area 102 at any position can only be designed according to a maximum radius desired by a design space, and thus the bezel area 102 of the circular display panel is enlarged, and a narrow bezel of the circular display panel cannot be realized.

Figure 2:
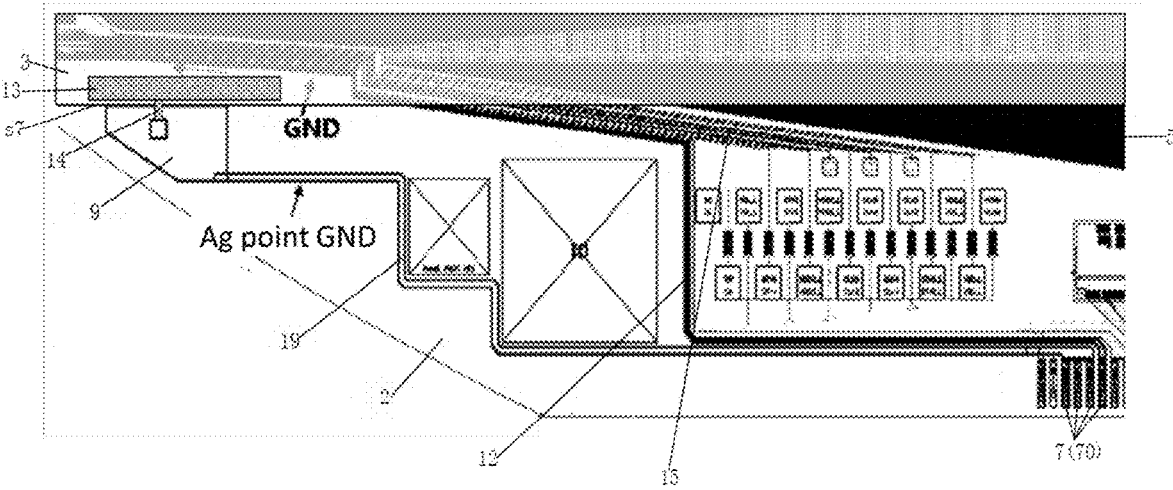
FIG. 2 is a schematic top view illustrating a structure of a bonding side bezel area of a circular display panel according to the related art.

In addition, FIG. 2 is a schematic top view illustrating a structure of a bonding side bezel area of a circular display panel according to the related art, and referring to FIG. 2, a lower side bezel area (i.e., a bezel area at a lower side) of the display panel is the bonding side bezel area 108, the display panel is formed by aligning and combining an array substrate 2 and a color filter substrate 3 opposite to each other to form a cell, the array substrate 2 is partially exposed in the bonding side bezel area 108, a bonding connection circuit is arranged in an exposed area on the array substrate 2, the bonding connection circuit includes a plurality of bonding connection terminals 7 arranged at intervals along a straight line, an end of each bonding connection terminal 7 is connected with a peripheral driving circuit, another end of each bonding connection terminal 7 is bonded and connected with an end of a flexible circuit board, and another end of the flexible circuit board is bonded and connected with a peripheral circuit board, so that the peripheral circuit board is connected with the peripheral driving circuit. The array substrate 2 is further provided with a shielding grounded electrode 9 in the bonding side bezel area 108, the shielding grounded electrode 9 is correspondingly located at an edge line s7 of the color filter substrate 3 corresponding to the bonding side bezel area 108, three bonding connection terminals 7 in the bonding connection circuit are led out through lead wires 19 and connected to the shielding grounded electrode 9, and the shielding grounded electrode 9 is connected to an electrostatic discharge electrode 13 located on a side of the color filter substrate 3 away from the array substrate 2 through a conductive adhesive 14 partially wrapping on the edge of the color filter substrate 3 corresponding to the bonding side bezel area 108, so that accumulated static electricity inside the display panel is released. Moreover, another bonding connection terminal 7 is led out through a lead wire and connected with a shielding signal line 12 looping around the bezel area 102, and the bonding connection terminal 7 is grounded so as to release the static electricity accumulated on the shielding signal line 12 to the ground. Thus, four bonding connection terminals 7 to be grounded are desired by the bonding side bezel area 108, and a width of the bonding side bezel area 108, in a direction in which the bonding connection terminals 7 are arranged, is increased. Meanwhile, an arrangement of the shielding signal line 12 and the lead wires connected to the shielding grounded electrode 9 in the bonding side bezel area 108 further increases the width of the bonding side bezel area 108 in a direction away from the display area 101, and thus the narrow bezel of the bonding side bezel area 108 cannot be realized.

Figure 3A:
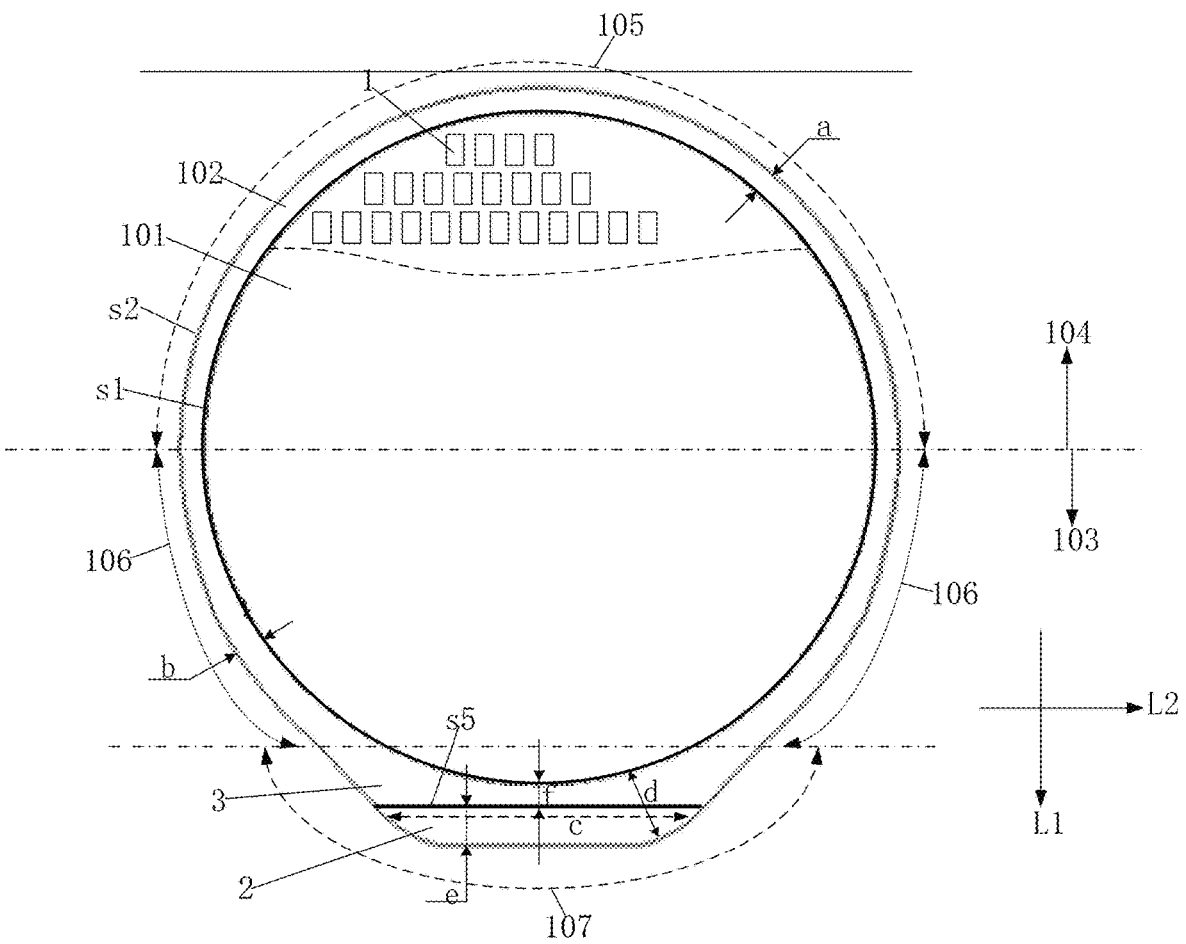
FIG. 3*a* is a schematic top view illustrating a structure of a display panel according to the present disclosure.
Figure 3B:
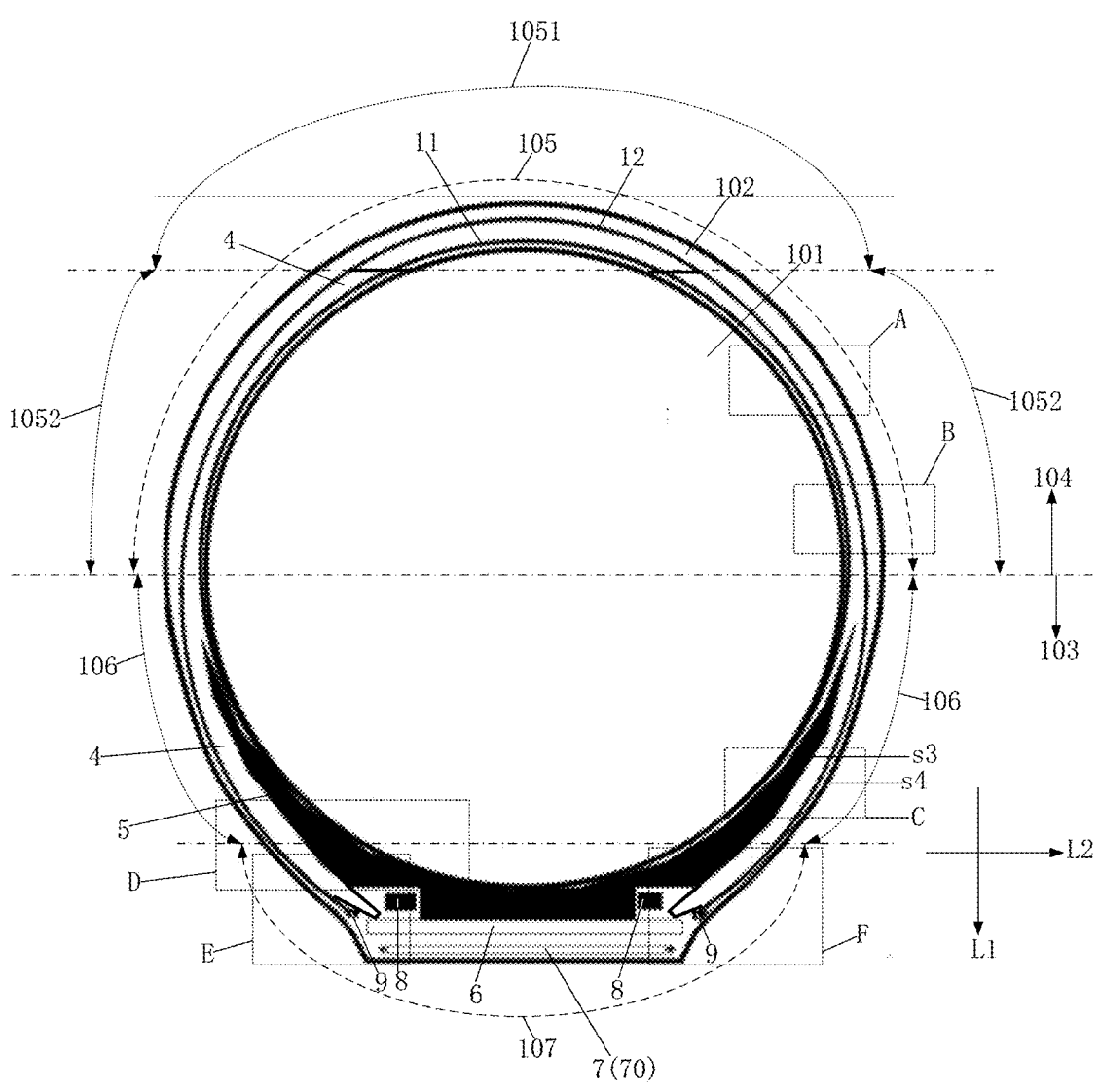
FIG. 3*b* is a schematic top view illustrating a structure of a display panel according to the present disclosure.
Figure 3C:
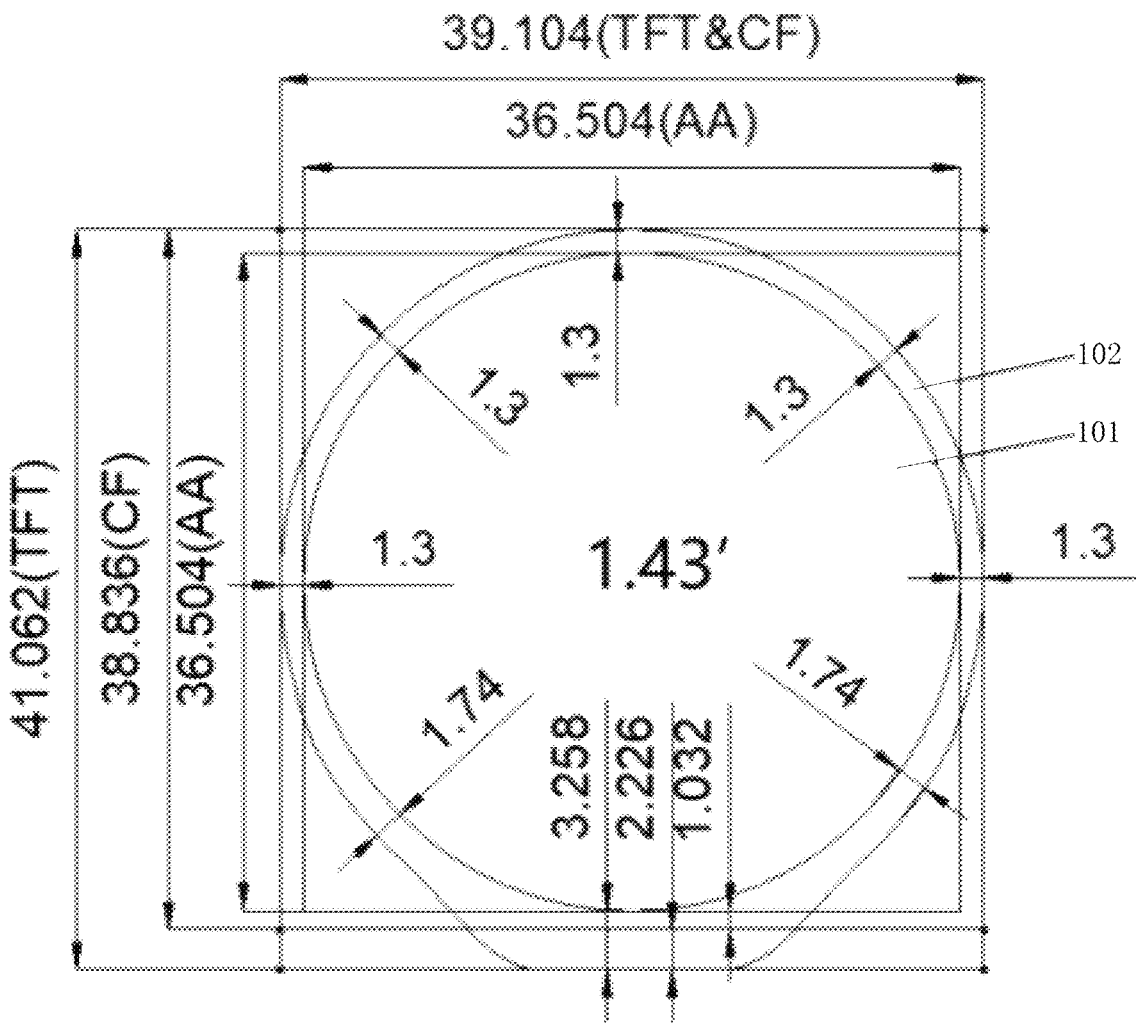
FIG. 3*c* is a schematic top view illustrating a structure of a display panel in 1.43 inches according to the present disclosure.
Figure 4:
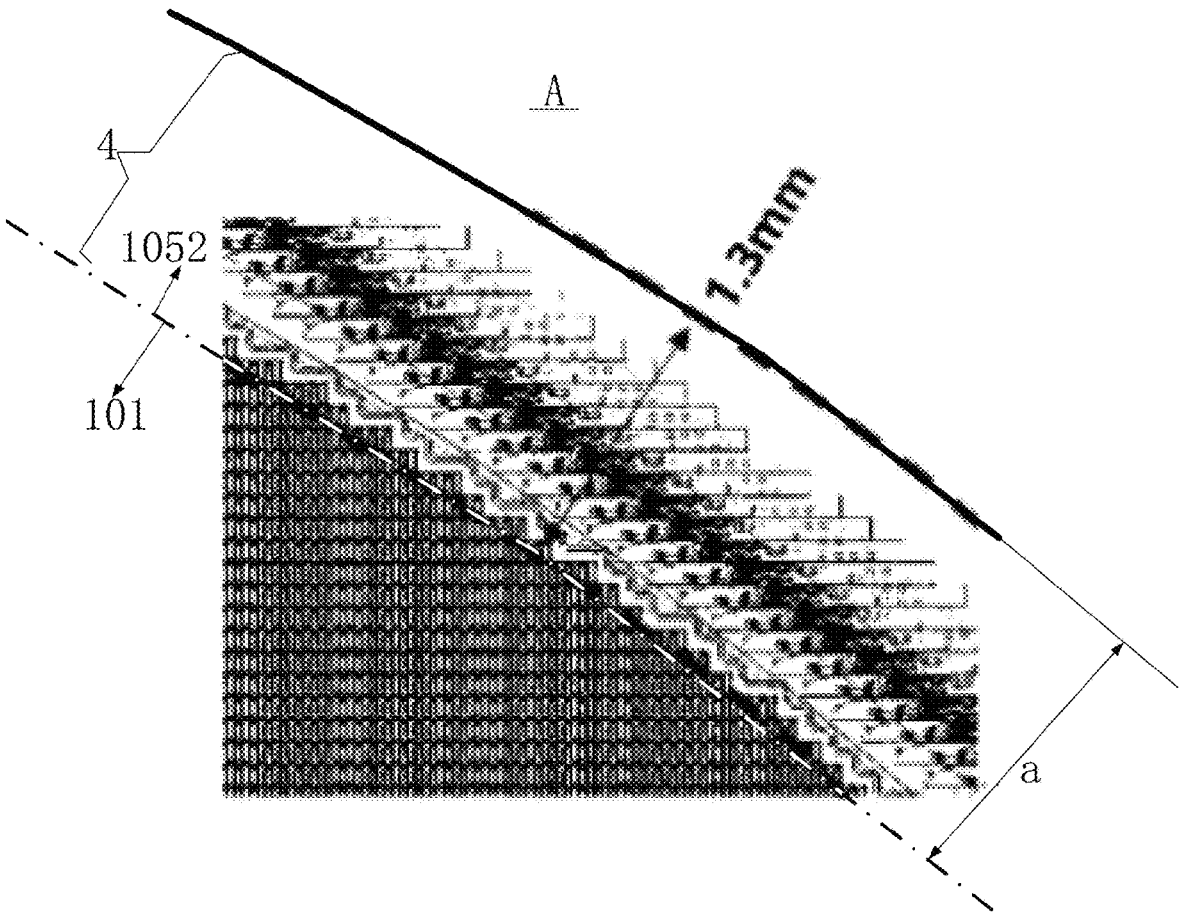
FIG. 4 is an enlarged view of part A of FIG. 3*b*.

In order to solve above problems in the related art, in a first aspect, an embodiment of the present disclosure provides a display panel, FIG. 3*a* is a schematic top view illustrating a structure of a display panel according to the embodiment of the present disclosure, FIG. 3*b* is a schematic top view illustrating a structure of a display panel according to the embodiment of the present disclosure, FIG. 3*c* is a schematic top view illustrating a structure of a display panel in 1.43 inches according to the embodiment of the present disclosure, and referring to FIGS. 3*a* to 3*c*, the display panel has a display area 101 and a bezel area 102, the bezel area 102 is arranged around the display area 101, and an edge line s1 of the display area 101 is a circular arc edge line, an edge line s2 of the bezel area 102 is a circular arc edge line, the edge line s1 of the display area 101 is matched in shape with the edge line s2 of the bezel area 102, the display panel includes a peripheral circuit and peripheral signal lines, the peripheral circuit and the peripheral signal lines are distributed in the bezel area 102, and the peripheral circuit and the peripheral signal lines are sequentially distributed along a direction away from the display area 101, the display panel further includes an array substrate 2 and a color filter substrate 3, and the array substrate 2 and the color filter substrate 3 are aligned and combined opposite to each other to form a cell, the array substrate 2 and the color filter substrate 3 are not overlapped at edges thereof on a first side 103; in the bezel area 102 outside the bezel area 102 where the edges on the first side 103 are located, a distance between the peripheral signal line closest to an outer edge of the bezel area 102 and the outer edge of the bezel area 102 is a range of 0.35±0.2 micrometers, the outer edge of the bezel area 102 is an edge of the bezel area 102 away from the display area 101.

Pixels 1 in an array are distributed in the display area 101. The pixels 1 each may be a Liquid Crystal (LCD) pixel or an organic light emitting diode (OLED) pixel. The peripheral circuit and the peripheral signal lines are configured to drive the pixels 1 in the array to perform displaying.

In some implementations, a width of the bezel area 102 at any position is a minimum width that can accommodate the peripheral circuit and peripheral signal lines distributed at that position. The minimum width of the bezel area 102 at any position is the narrowest width that can be achieved by processes in a case where the peripheral circuit and the peripheral signal lines are fully laid at that position.

According to the embodiment of the present disclosure, the edge line s1 of the display area 101 is made to be a circular arc edge line; the edge line s2 of the bezel area 102 is a circular arc edge line; the edge line s1 of the display area 101 is matched in shape with the edge line s2 of the bezel area 102, so that a circular or approximately circular display panel can be achieved, and the width of the bezel area 102 at any position is the minimum width capable of accommodating the peripheral circuit and the peripheral signal lines distributed at that position, on one hand, a sufficient design space of the bezel area 102 of the circular or approximately circular display panel can be ensured, and on the other hand, a narrow bezel of the circular or approximately circular display panel can be realized, thereby the circular or approximately circular display panel can save space to the maximum extent.

Figure 5:
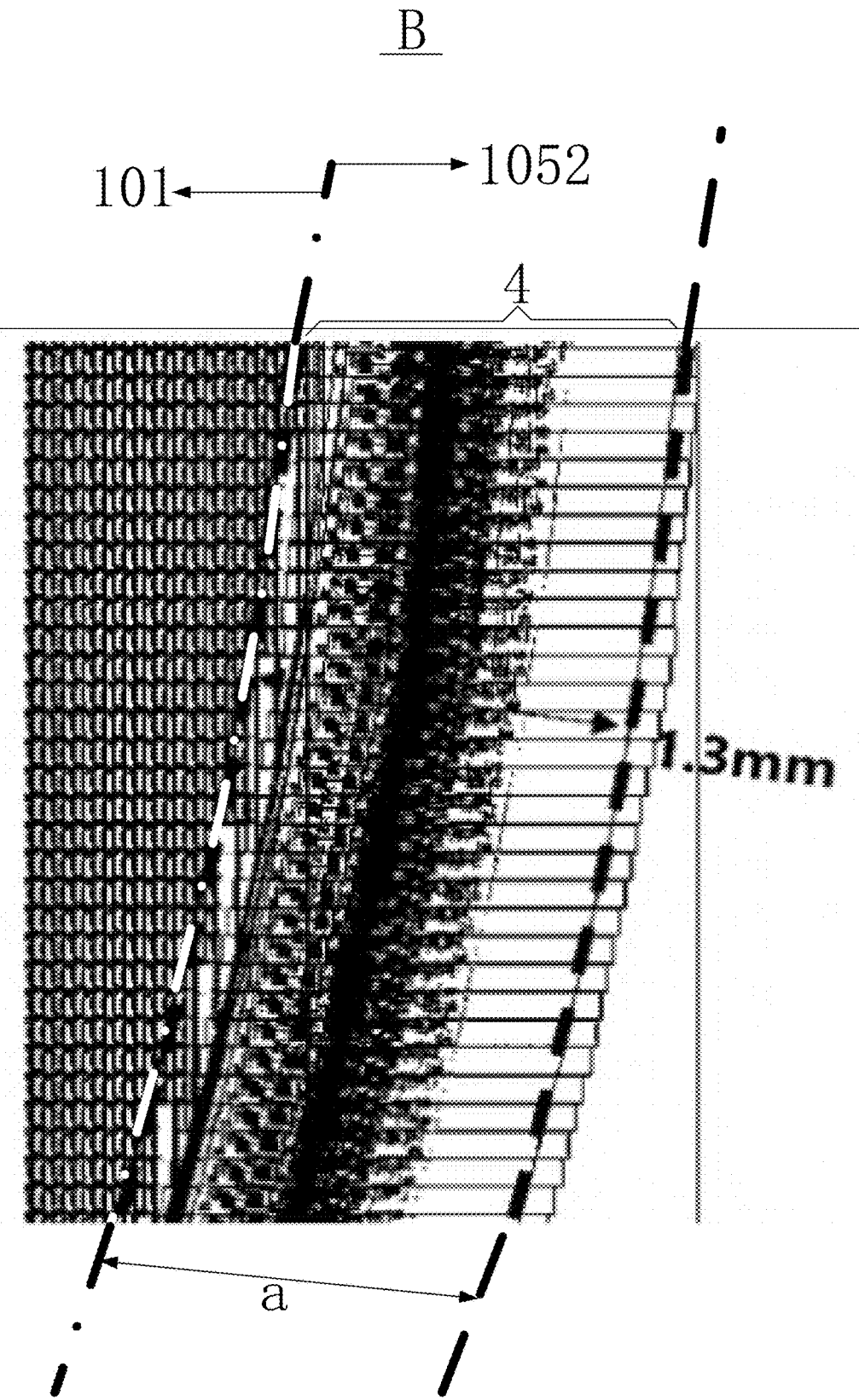
FIG. 5 is an enlarged view of part B of FIG. 3*b*.
Figure 6:
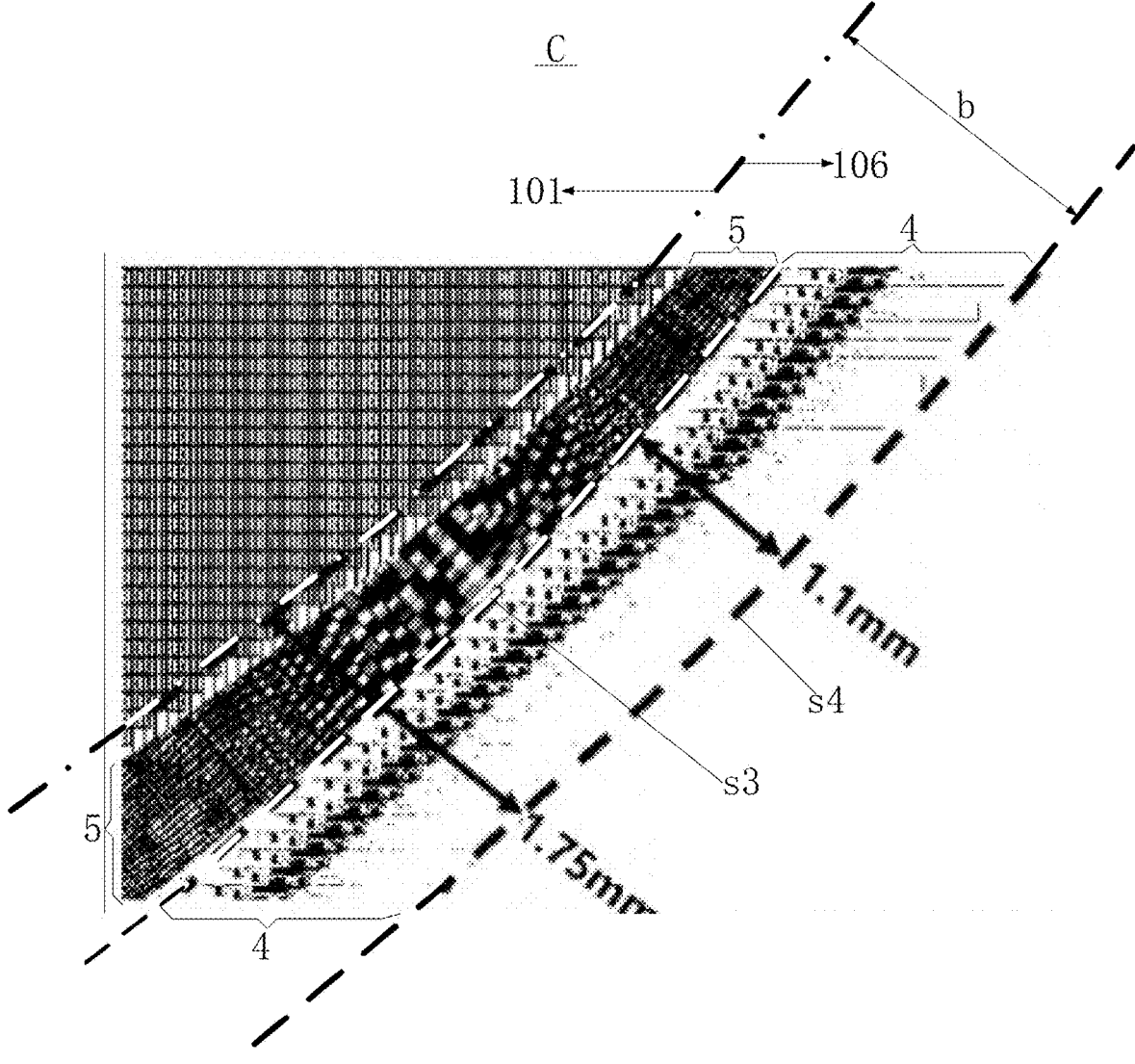
FIG. 6 is an enlarged view of part C of FIG. 3*b*.
Figure 7:
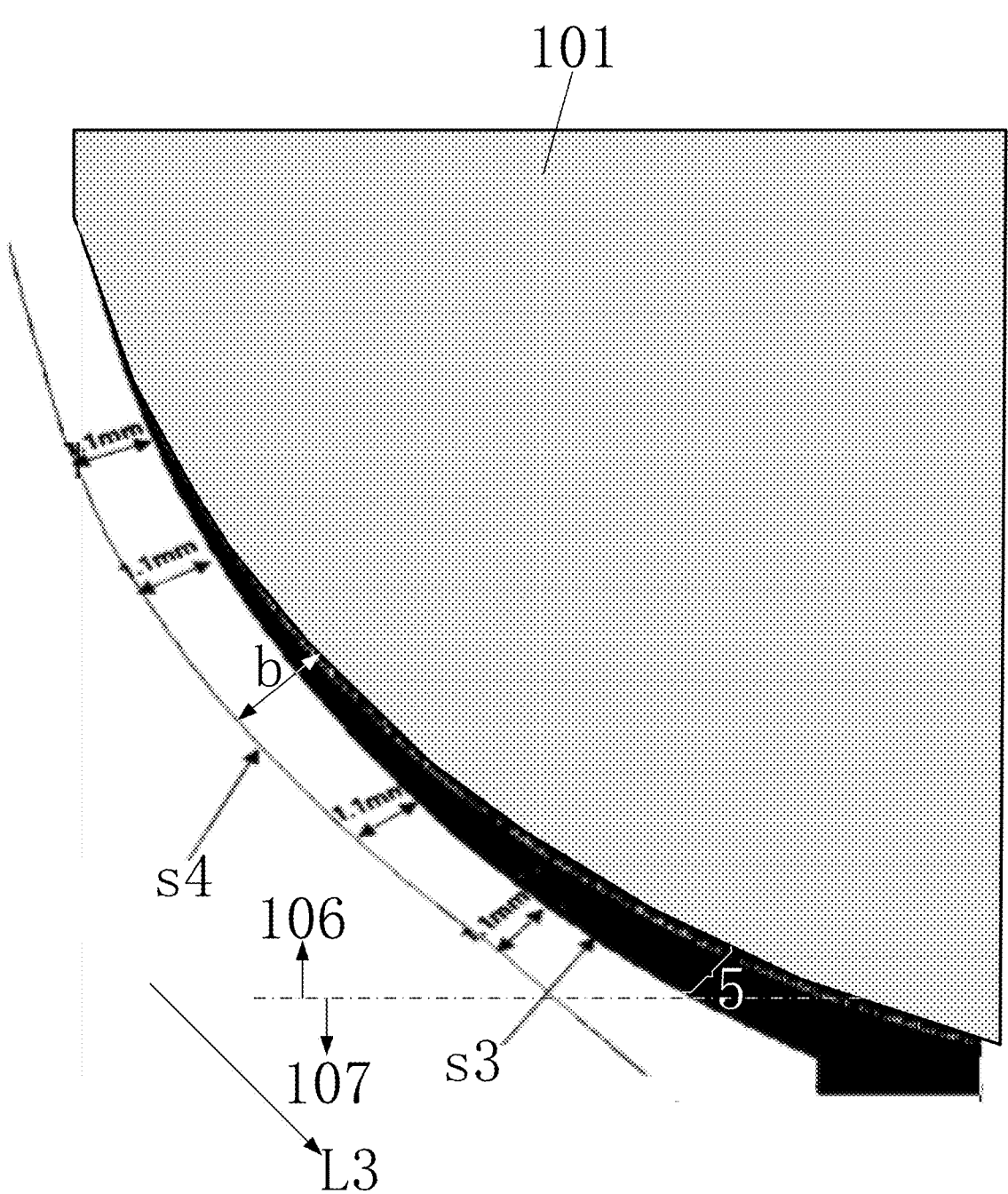
FIG. 7 is an enlarged view of part D of FIG. 3*b*.

In some implementations, referring to FIGS. 3*a*, 3*b*, 3*c*, 4 and 5, FIG. 4 is an enlarged view of part A of FIG. 3*b*; FIG. 5 is an enlarged view of part B of FIG. 3*b*, the display panel includes the array substrate 2 and the color filter substrate 3, and the array substrate 2 and the color filter substrate 3 are aligned and combined opposite to each other to form the cell, the array substrate 2 and the color filter substrate 3 are not overlapped at the edges thereof on the first side 103, the display area 101 is circular, the display area 101 is located in an area in which orthographic projections of the array substrate 2 and the color filter substrate 3 are overlapped, the bezel area 102 includes a first part 105, the first part 105 is located on a second side 104 of the array substrate 2 and the color filter substrate 3 which are aligned and combined opposite to each other, and the second side 104 is opposite to the first side 103, an edge line of the first part 105 is a semicircular arc edge line, which has a circle center coinciding with a circle center of a semicircular arc edge line of the display area 101 on the second side 104.

The circle center of the semicircular arc edge line of the first part 105 being coinciding with the circle center of the semicircular arc edge line of the display area 101 on the second side 104 includes an absolute coincidence between circle centers of such two semicircular arc edge lines, and also includes an approximate coincidence between the circle centers of the two semicircular arc edge lines within a certain error range.

In some implementations, the first part 105 includes a first sub-part 1051 and a second sub-part 1052, the first sub-part 1051 is located on a side of the display area 101 away from the first side 103, the second sub-part 1052 is divided to be arranged on two opposite edges of the display area 101 along a second direction L2; the first side 103 and the second side 104 of the array substrate 2 and the color filter substrate 3 which are aligned and combined opposite to each other are arranged along a first direction L1, the second direction L2 is perpendicular to the first direction L1, the peripheral circuit includes a shift register circuit 4, the peripheral signal lines include a first signal line connected to the shift register circuit 4, the shift register circuit and the first signal line are not distributed in the first sub-part 1051, a part of the shift register circuit 4 and a part of the first signal lines are distributed in the second sub-part 1052, total distribution widths, at arbitrary positions, of the shift register circuit 4 and the first signal line distributed in the second sub-part 1052 are the same, that is, total widths of an area, occupied by a distribution of the shift register circuit 4 and the first signal line, at arbitrary positions in the second sub-part 1052 are equal.

In some implementations, the total distribution widths, at arbitrary positions, of the shift register circuit 4 and the first signal line distributed in the second sub-part 1052 being the same does not only mean that the total distribution widths are absolutely the same, but also includes a case that the total distribution widths are approximately the same within a certain error range. That is, the total widths of the area, occupied by a distribution of the shift register circuit 4 and the first signal line, at arbitrary positions in the second sub-part 1052 may be absolutely equal or may be approximately equal within a certain error range, and the total distribution width may include a certain measurement error (i.e., a difference caused by the certain measurement error may exist between the total widths), for example, the measurement error is about 0.3 μm.

In the first part 105 of the bezel area 102, the shift register circuit 4 and the first signal line connected to the shift register circuit 4 are mainly distributed. The edge line of the first part 105 of the bezel area 102 and the edge line of the corresponding part of the display area 101 are concentric circular arcs having a same circle center, which can make an appearance of the display panel corresponding to the first part 105 more beautiful, and can ensure a sufficient design space of the first part 105 of the bezel area 102 and ensure a narrow bezel to be realized.

In some implementations, the shift register circuit 4 is the GOA circuit, and is configured to provide a row scan signal to the pixels 1 arranged in the array in the display area 101, which causes the pixels 1 arranged in the array to be turned on row by row, or causes the pixels 1 in multiple rows to be turned on simultaneously, so as to perform displaying by the pixels 1 row by row or perform displaying by the pixels 1 in multiple rows simultaneously.

In some implementations, the first signal line connected to the shift register circuit 4 is, for example, a gate line, a light emitting control signal line, a reset signal line, a clock signal line, a scan triggering signal line, a power signal line, or the like.

In some implementations, a width a of the first part 105 is in a range from 1.0 mm to 2.7 mm, and the width a of the first part 105 refers to a dimension of the first part 105 in the direction away from the display area 101.

In some implementations, the display panel has a dimension of 1.43 inches and the width a of the first part 105 is about 1.3 mm.

In some implementations, referring to FIGS. 3*a*, 3*b*, 3*c* and 6, FIG. 6 is an enlarged view of part C of FIG. 3*b*, the bezel area 102 further includes a second part 106 and a third part 107, the second part 106 and the third part 107 are located on the first side 103 of the array substrate 2 and the color filter substrate 3 which are aligned and combined opposite to each other, and the second part 106 and the third part 107 are sequentially arranged along the first direction L1 away from the first part 105, the first direction L1 is the direction in which the first side 103 and the second side 104 of the array substrate 2 and the color filter substrate 3 are arranged, the second part 106 is divided to be arranged on two opposite edges of the display area 101 along the second direction L2, the second direction L2 is perpendicular to the first direction L1, the third part 107 is located at the edge of the display area 101 on the first side 103, the peripheral signal lines further include a data line 5, the data line 5, a part of the shift register circuit 4 and a part of the first signal line are distributed in the second part 106 and the third part 107, and the data line 5 and the shift register circuit 4 are sequentially distributed away from the display area 101, the total distribution widths, at arbitrary positions, of the shift register circuit 4 and the first signal line distributed in the second part 106 are the same, that is, the total widths of the area, occupied by the distribution of the shift register circuit 4 and the first signal line, at arbitrarily positions in the second part 106 are equal. The total distribution width of the shift register circuit 4 and the first signal line refers to the total width of the area, occupied by the distribution of both the shift register circuit 4 and the first signal line, in the direction away from the display area 101.

In some implementations, the total distribution widths, at arbitrary positions, of the shift register circuit 4 and the first signal line distributed in the second part 106 being the same does not only mean that the total distribution widths are absolutely the same, but also includes a case where the total distribution widths are approximately the same within a certain error range. That is, the total widths of the area, occupied by the distribution of the shift register circuit 4 and the first signal line, at arbitrary positions in the second sub-part 1052 may be absolutely equal or may be approximately equal within a certain error range.

In the second part 106 of the bezel area 102, the data line 5, the shift register circuit 4, and the first signal line connected to the shift register circuit 4 are mainly distributed. The total distribution widths, at arbitrary positions, of the shift register circuit 4 and the first signal line distributed in the second part 106 being the same, means that in the second part 106, an edge line s3 of an area in which the data line 5 close to the display area 101 is distributed is parallel or approximately parallel to an edge line s4 of the second part 106, and distances at arbitrarily positions between the edge line s3 of the area in which the data line 5 is distributed and the edge line s4 of the second part 106 are equal, so that on one hand, a portion of the display panel corresponding to the second part 106 is arc-shaped or approximately arc-shaped, which ensures that an appearance of the portion of the display panel corresponding to the second part 106 is more beautiful, and on the other hand, a sufficient design space of the second part 106 of the bezel area 102 and a narrow bezel can be ensured to be realized.

In some implementations, the distribution width of the data line 5 (i.e., a width of an area in which the data line 5 is distributed, or a width of an area occupied by the data line

5) in the second part 106 gradually increases from an end of the second part 106 close to the first part 105 to an end of the second part 106 close to the third part 107. The distribution width of the data line 5 refers to a dimension of the area, in which the data line 5 is distributed, along the direction away from the display area 101, or a dimension of the area, occupied by the data line 5, along the direction away from the display area 101.

In some implementations, referring to FIGS. 3*a*, 3*b*, 3*c*, and 7, FIG. 7 is an enlarged view of part D of FIG. 3*b*, in a distribution area from the second part 106 to the third part 107, the distribution width of the data line 5 gradually increases from the second part 106 to the third part 107.

In some implementations, referring to FIGS. 3*a*, 3*b*, 3*c* and 7, a width of the second part 106 gradually increases along a distribution direction L3 from the second part 106 to the third part 107. The width of the second part 106 refers to a dimension of the second part 106 in the direction away from the display area 101.

In some implementations, the width b of the second part 106 is in a range from 1.5 mm to 3.2 mm.

In some implementations, the width b of the second part 106 is about 1.74 mm for the display panel in 1.43 inches.

In some implementations, a distance between the edge line s3 of the area in which the data line 5 is distributed and the edge line s4 of the second part 106 is about 1.1 mm at each position in the second part 106.

In some implementations, the distance between the edge line s3 of the area in which the data line 5 is distributed and the edge line s4 of the second part 106 being about 1.1 mm at each position does not only mean that the distance is exactly 1.1 mm, but also includes a case that the distance is approximate to 1.1 mm within a certain error range.

Figure 8:
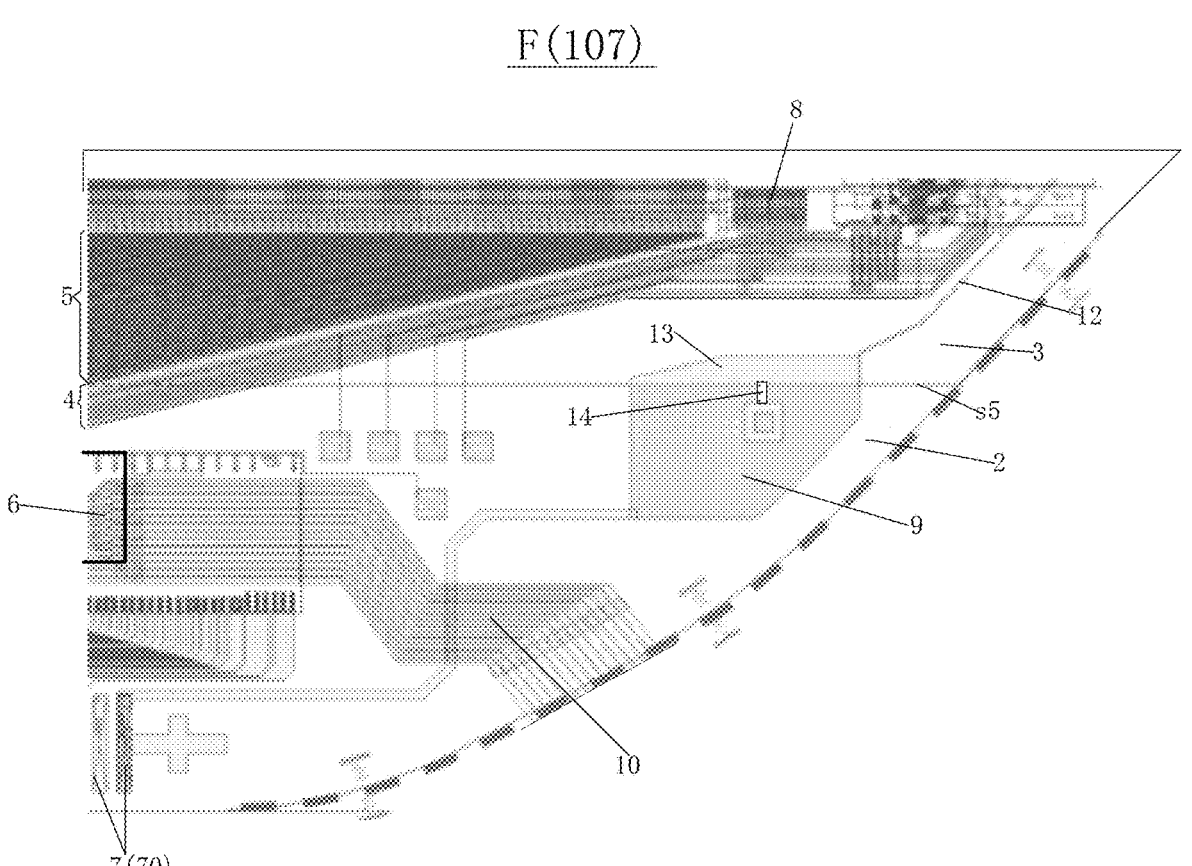
FIG. 8 is an enlarged view of part F of FIG. 3*b*.
Figure 9:
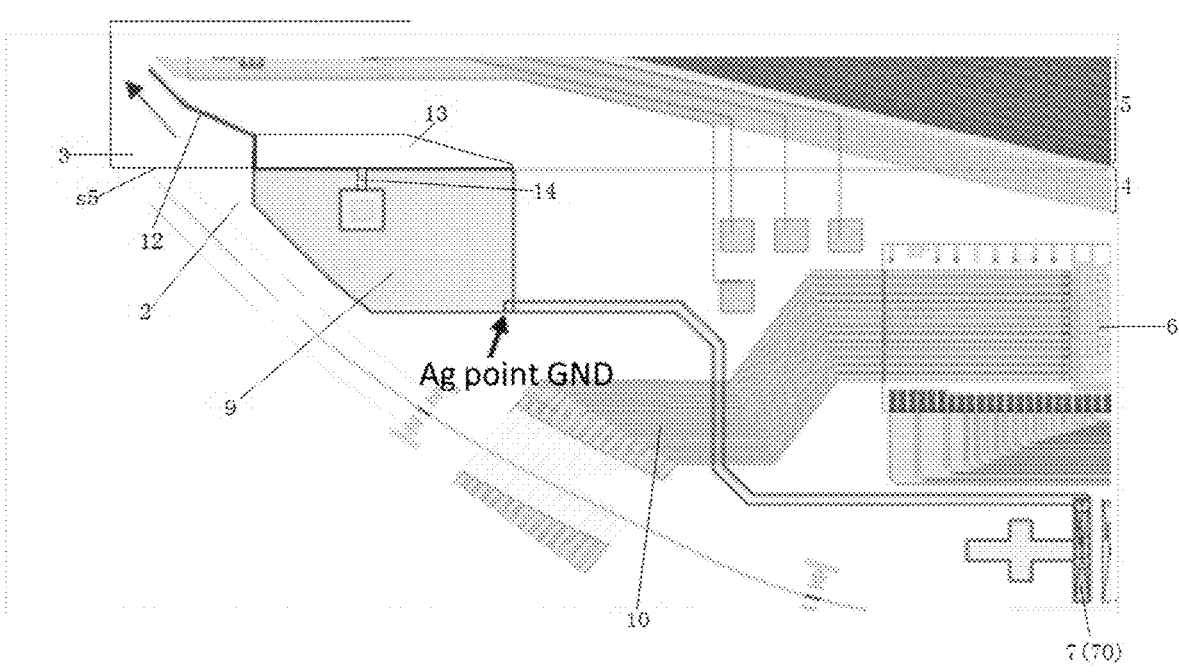
FIG. 9 is an enlarged view of part E of FIG. 3*b*.
Figure 10:
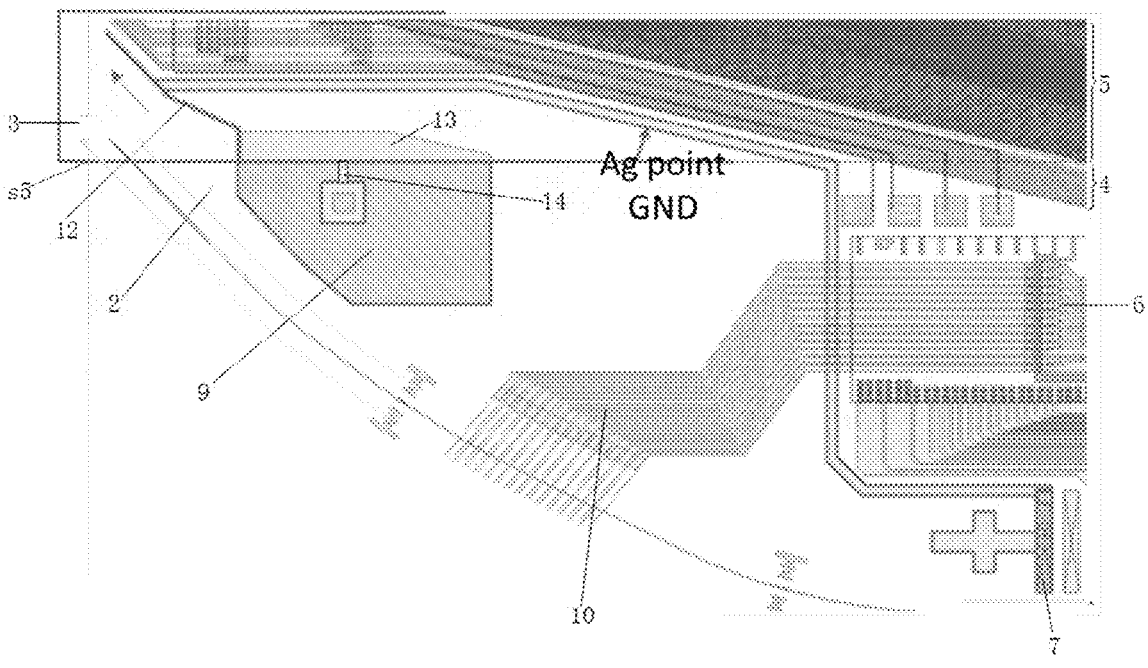
FIG. 10 is another enlarged view of part E of FIG. 3*b*.

In some implementations, referring to FIGS. 3*a*, 3*b*, 3*c*, 8-10, FIG. 8 is an enlarged view of part F of FIG. 3*b*; FIG. 9 is an enlarged view of part E of FIG. 3*b*; FIG. 10 is another enlarged view of part E of FIG. 3*b*; the peripheral circuit further includes a driving circuit 6, a bonding connection terminal 7, an electrostatic discharge circuit 8 and a shielding grounded electrode 9, the peripheral signal lines further include a test signal line group 10, a common voltage signal line 11, and a shielding signal line 12; the driving circuit 6, the bonding connection terminal 7, the electrostatic discharge circuit 8, the shielding grounded electrode 9 and the test signal line group 10 are distributed in the third part 107, the bonding connection terminal 7 and the test signal line group 10 are respectively connected with the driving circuit 6, the shielding signal line 12 is connected with the shielding grounded electrode 9 and the bonding connection terminal 7, the common voltage signal line 11 is connected with the shift register circuit 4 and the electrostatic discharge circuit 8; the shielding signal line 12 and the common voltage signal line 11 respectively extend from the third part 107 to the second part 106 and the first part 105, and the shielding signal line 12 and the common voltage signal line 11 respectively loop around the display area 101, the common voltage signal line 11 is located in an area between the display area 101 and the shift register circuit 4, the peripheral circuit and other peripheral signal lines distributed in the bezel area 102 are located in an area between the shielding signal line 12 and the display area 101.

The driving circuit 6 includes a gate driving chip (Gate IC) and a data driving chip (Data IC), and the gate driving chip is configured to provide a driving signal for the shift register circuit 4, the data driving chip is configured to provide a data signal for the data line 5, the gate driving chip and the data driving chip are configured to provide driving signals for driving the pixels 1 arranged in the array in the display area 101 to perform displaying. The bonding connection terminal 7 is configured to be bonded and connected with an end of the flexible circuit board, and another end of the flexible circuit board is bonded and connected with the peripheral circuit board, so that the peripheral circuit board is connected with the driving circuit 6, and the peripheral circuit board provides a display data signal for the driving circuit 6. The test signal line group 10 is prepared on the array substrate 2 and is configured to test a circuit on the array substrate 2, after the array substrate 2 is prepared, the test signal line group 10 is used to connect the driving circuit 6 with the peripheral circuit board to test the circuit on the array substrate 2, and after the test is finished, the test signal line group 10 is cut off at an edge position of the circular display panel in a cutting process subsequent to the display panel being prepared, and a part of the test signal line group 10 reserved on the array substrate 2 is idle and is not to be used any more. The shielding signal line 12 is configured to shield external static electricity, so as to prevent the external static electricity from damaging circuits (such as the peripheral circuit and other peripheral signal lines in the bezel area 102, and circuits and signal lines in the display area 101) in the display panel.

Figure 11:
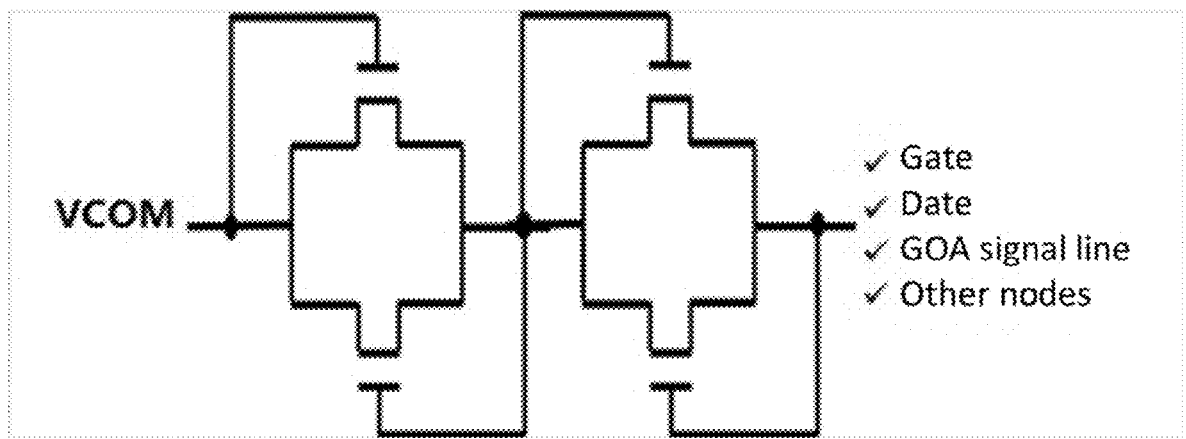
FIG. 11 is a circuit diagram of an electrostatic discharge circuit.

In some implementations, referring to FIG. 11, which is a circuit diagram of an electrostatic discharge circuit, an end of the electrostatic discharge circuit 8 may be connected to some signal lines (e.g., gate lines and other GOA signal lines) and circuit nodes in the shift register circuit 4, and some signal lines (e.g., the data line, Data) and circuit nodes in the display area 101, which are easy to accumulate static electricity therein or thereon, and another end of the electrostatic discharge circuit 8 is connected to a common voltage signal line (VCOM) for discharging the static electricity accumulated in the circuits or on the signal lines mentioned above to the common voltage signal line. In addition, the common voltage signal line 11 is further configured to supply a common voltage signal to pixel circuits in the display area 101 and the peripheral circuit in the bezel area 102.

In some implementations, referring to FIGS. 3a, 3b and 3c, a width c of the third part 107 in the second direction L2 gradually decreases in a direction away from the second part 106.

In some implementations, referring to FIGS. 3a, 3b and 3c, the bonding connection terminal 7 is located on a side of the driving circuit 6 away from the display area 101, the data line 5 distributed in the third part 107 is located on a side of the driving circuit 6 close to the display area 101, the electrostatic discharge circuit 8 is located on opposite sides of an area, in which the data line 5 is distributed, along the second direction L2, the shielding grounded electrode 9 is located on at least one side of the driving circuit 6 along the second direction L2, and the shielding grounded electrode 9 is located on a side of the shift register circuit 4 away from the display area 101, data lines 5 in the third part 107 are distributed in a fan shape or an inverted trapezoid shape, thus the third part 107 may have a fan shape or an inverted trapezoid shape, and with such an arrangement, on the basis of ensuring a sufficient design space of the third part 107, an extremely narrow bezel of the third part 107 can be realized, and the third part 107 has an attractive appearance.

In some implementations, the width c of the third part 107 along the second direction L2 ranges from 10 mm to 12 mm.

In some implementations, a width d of the third part 107 in the direction away from the display area 101 is in a range from 3.0 mm to 3.5 mm.

In some implementations, the width d of the third part 107 along the first direction L1 is about 3.258 mm for the display panel in 1.43 inches.

In some implementations, referring to FIGS. 3a, 3b, 3c, 8 and 9, the bonding connection terminal 7 includes a plurality of terminals 70, and the plurality of terminals 70 are sequentially arranged at intervals along the second direction L2; first and last terminals 70 are grounded, an end of the shielding signal line 12 is connected to the first terminal 70, extends to the shielding grounded electrode 9, and extends from the shielding grounded electrode 9 to loop around an outer side of the shift register circuit 4 away from the display area 101, and another end of the shielding signal line 12 is connected to the last terminal 70.

With such an arrangement, on one hand, the shielding signal line 12 can surround the peripheral circuit and other peripheral signal lines within the bezel area 102 in an encirclement formed by the shielding signal line 12, so as to avoid a damage to the peripheral circuit and other peripheral signal lines in the bezel area 102 and circuits and signal lines in the display area 101, caused by electric shock of external static electricity, on the other hand, compared with an arrangement of two ground signal lines, i.e., the shielding signal line in the bonding side bezel area and the lead wire connected to the shielding grounded electrode 9, in the related art of FIG. 2, according to the embodiment of the present disclosure, only one ground signal line (i.e., the shielding signal line 12) is arranged in the third part 107, meanwhile, in the related art of FIG. 2, three terminals 70 of the bonding connection terminal 7 are simultaneously connected to one lead wire, so as to be connected to the shielding grounded electrode 9, and another terminal 70 of the bonding connection terminal 7 is led out through a lead wire and connected to the shielding signal line 12 which loops around the bezel area 102, that is, a total of four grounded terminals 70 are desired at either of a head end and a tail end of the bonding connection terminal 7 in the related art of FIG. 2, by contrast, according to the embodiment of the present disclosure, only one grounded terminal 70 is desired at either of the head end and the tail end of the bonding connection terminal 7, thereby enabling the width c of the third part 107 along the second direction L2 and the width d of the third part 107 along the direction away from the display area 101 to be further narrowed, for achieving an extremely narrow bezel of the third part 107, that is, a width of a lower bezel, of the display panel, where the third part 107 is located is greatly reduced, which greatly improves a competitiveness of a small-sized circular display panel.

In some implementations, referring to FIG. 10, the bonding connection terminal 7 includes a plurality of terminals 70, and the plurality of terminals 70 are sequentially arranged at intervals along the second direction L2, first and last terminals 70 are grounded, an end of the shielding signal line 12 is connected to the first terminal 70 and extends in the third part 107 to an outer side of the shift register circuit 4 away from the display area 101 and an inner side of the shielding grounded electrode 9 close to the display area 101, the shielding signal line 12 is connected to the shielding grounded electrode 9 and extends from the shielding grounded electrode 9 to the second part 106 and the first part 105 to loop around the outer side of the shift register circuit 4 away from the display area 101, and another end of the shielding signal line 12 is connected to the last terminal 70.

That is, in the third part 107 according to the embodiment of the present disclosure, the shielding signal line 12 is located in an area between the shielding grounded electrode 9 and the shift register circuit 4, is distributed close to the outer side of the shift register circuit 4 away from the display area 101, and surrounds the shift register circuit 4 located in the third part 107 in the encirclement formed by the shielding signal line, in the second part 106 and the first part 105 according to the embodiment of the present disclosure, the shielding signal line 12 is arranged around the outer side of the shift register circuit 4 away from the display area 101, and the shift register circuit 4 in the second part 106 and the first part 105 is enclosed in the encirclement formed by the shielding signal line, so that external static electricity is well shielded, and the peripheral circuit and other peripheral signal lines in the bezel area 102 and circuits and signal lines in the display area 101 are prevented from being damaged by electric shock of the external static electricity, in addition, compared with an arrangement position of the shielding signal line 12 in the third part 107 in FIG. 9, an arrangement position of the shielding signal line 12 in the third part 107 according to the embodiment of the present disclosure is closer to the display area 101, so that the width c of the third part 107 along the second direction L2 and the width d of the third part 107 along the direction away from the display area 101 can be further narrowed, thereby realizing an extremely narrow bezel of the third part 107. Moreover, compared with an arrangement of the shielding signal line 12 and the bonding connection terminal 7 in the related art of FIG. 2, an arrangement of the shielding signal line 12 and the bonding connection terminal 7 in FIG. 10 according to the embodiment of the present disclosure can also narrow the width c of the third part 107 along the second direction L2 and the width d of the third part 107 along the direction away from the display area 101, so as to achieve an extremely narrow bezel of the third part 107, that is, greatly reduce a width of a lower bezel, of the display panel, where the third part 107 is located, and greatly improve a competitiveness of a small-sized circular display panel.

In some implementations, referring to FIGS. 8 to 10, the peripheral circuit and the peripheral signal lines are formed on the array substrate 2, an orthographic projection of the color filter substrate 3 on the array substrate 2 is not overlapped with the driving circuit 6 and the bonding connection terminal 7, an orthographic projection of an edge line s5, on the first side 103, of the color filter substrate 3 on the array substrate 2 is located on the array substrate 2, and the orthographic projection of the edge line s5, on the first side 103, of the color filter substrate 3 on the array substrate 2 is partially overlapped with the shielding grounded electrode 9, an electrostatic discharge electrode 13 is disposed on a surface of the color filter substrate 3 away from the array substrate 2, and corresponds to the shielding grounded electrode 9 in position, and the electrostatic discharge electrode 13 is connected to the shielding grounded electrode 9 through a conductive adhesive 14 extending to partially cover an end surface at the edge of the color filter substrate 3 on the first side 103.

The conductive adhesive 14 may be conductive silver adhesive. The static electricity accumulated on the shielding grounded electrode 9 can be released to the electrostatic discharge electrode 13 located on the side, away from the array substrate 2, of the color filter substrate 3 through the conductive adhesive 14, and the electrostatic discharge electrode 13 can bear a large amount of static electricity, so that the static electricity accumulated on the shielding grounded electrode 9 is conducted or transferred outside of the display panel, and the static electricity is prevented from causing electric shock to damage the circuits or signal lines inside the display panel.

In some implementations, referring to FIGS. 3a, 3b, 3c, and 8 to 10, a dimension of the color filter substrate 3 along the first direction L1 is less than a dimension of the array substrate 2 along the first direction L1, the driving circuit 6, the bonding connection terminal 7, the test signal line group 10, a part of the data line 5, and a part of the shielding grounded electrode 9 are exposed outside the edge line s5 of the color filter substrate 3 on the first side 103. That is, the driving circuit 6, the bonding connection terminal 7, the test signal line group 10, a part of the data line 5 and a part of the shielding grounded electrode 9 are located in an area, on the array substrate 2, which is not overlapped with the color filter substrate 3. The area of the array substrate 2 not overlapped with the color filter substrate 3 serves as a bonding area of the display panel.

In some implementations, referring to FIGS. 3a, 3b and 3c, for the display panel in 1.43 inches, a maximum distance e between the edge line of the array substrate 2 on the first side 103 and the edge line s5 of the color filter substrate 3 on first side 103 is about 2.226 mm, a minimum distance f between the edge line s5, on the first side 103, of the color filter substrate 2 and the edge line, on the first side 103, of the display area 101 is about 1.032 mm.

Figure 12A:
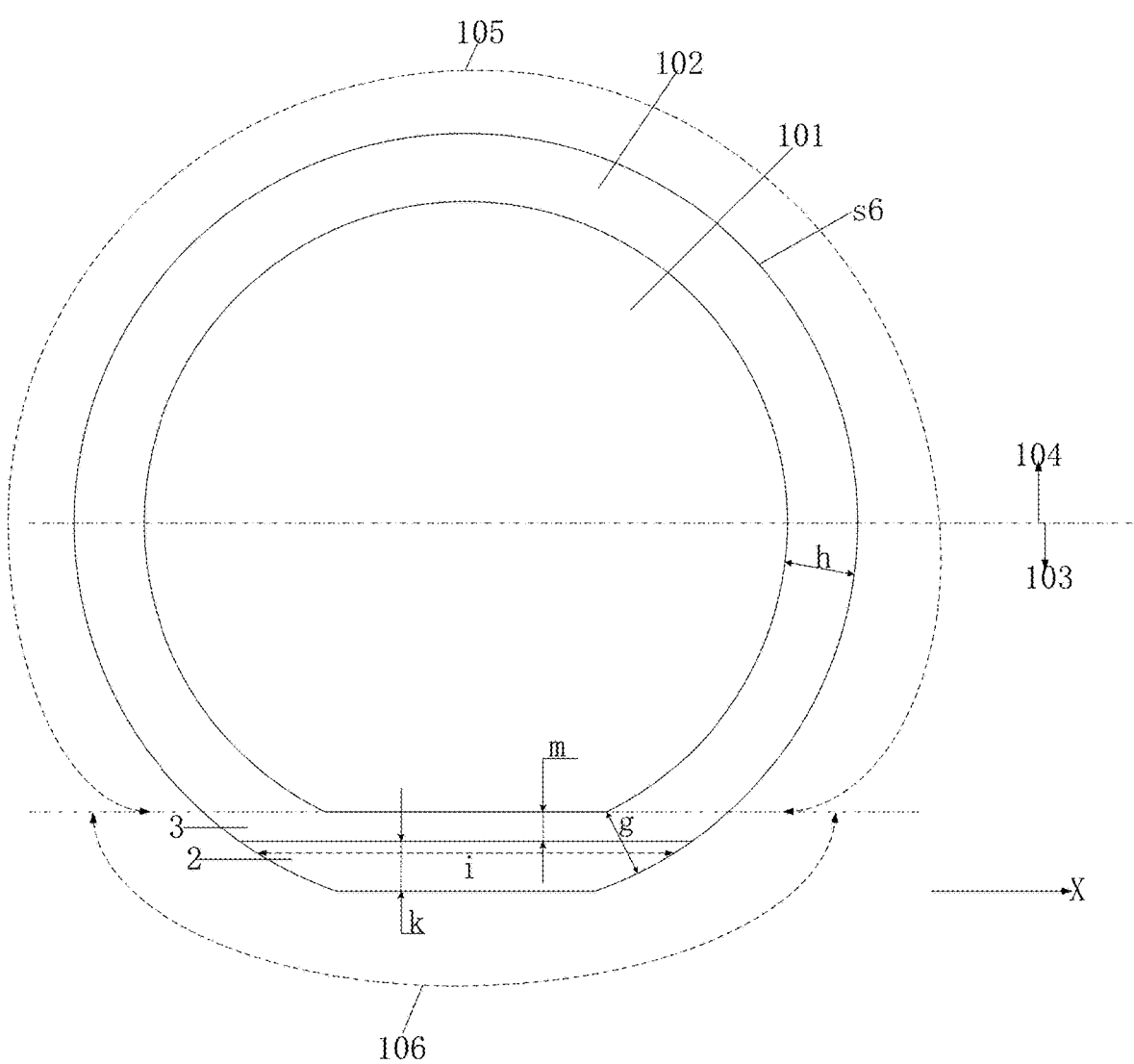
FIG. 12*a* is a schematic top view illustrating a structure of another display panel according to the present disclosure.
Figure 12B:
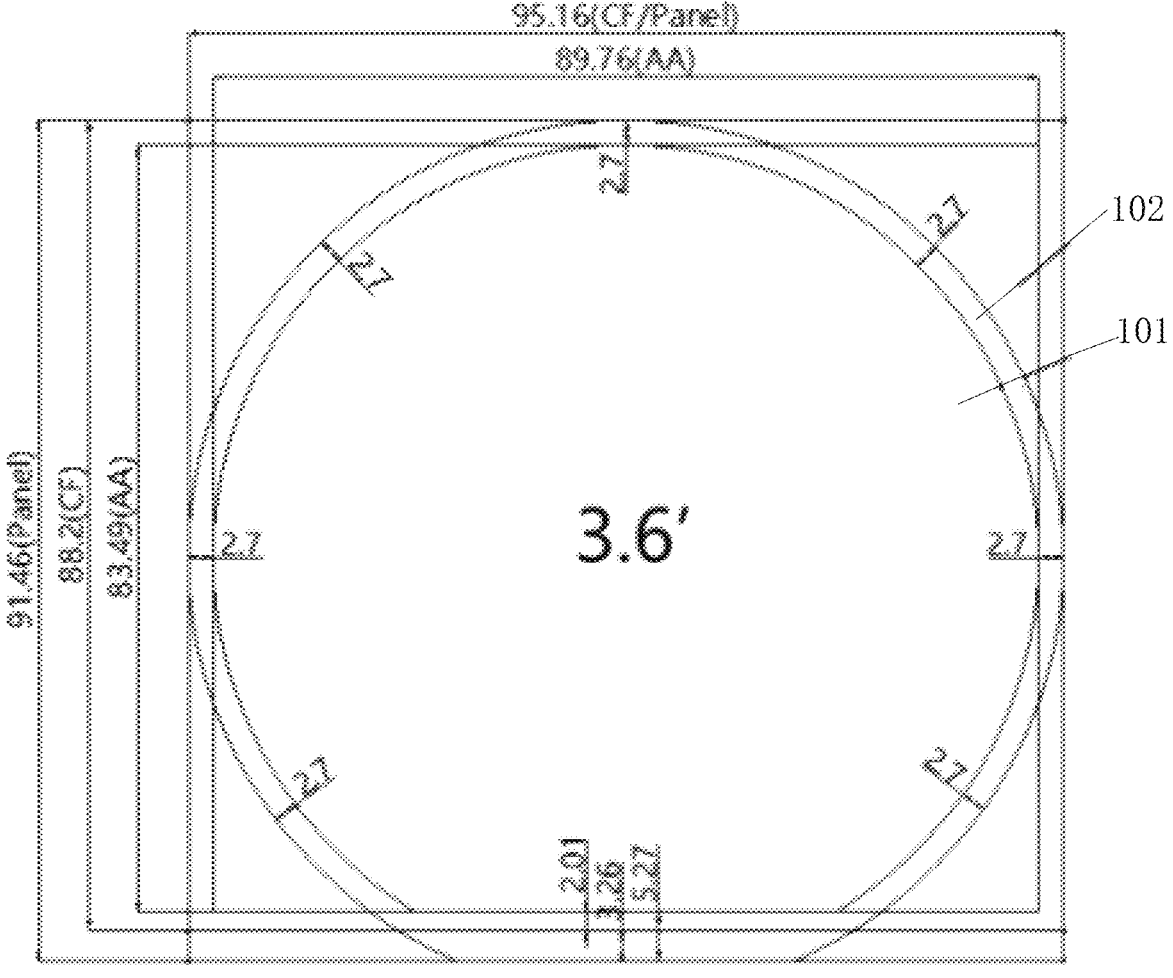
FIG. 12*b* is a schematic top view illustrating a structure of a display panel in 3.6 inches according to the present disclosure.

An embodiment of the present disclosure further provides a display panel, which is different from that in the foregoing embodiment in that, referring to FIG. 12a illustrating a schematic top view illustrating a structure of a display panel according to the embodiment of the present disclosure, FIG. 12b illustrating a schematic top view illustrating a structure of a display panel in 3.6 inches according to the embodiment of the present disclosure, the display panel includes an array substrate 2 and a color filter substrate 3, and the array substrate 2 and the color filter substrate 3 are aligned and combined opposite to each other to form a cell, the array substrate 2 and the color filter substrate 3 are not overlapped at edges thereof on the first side 103, the display area 101 is circular, the display area 101 is located in an area in which orthographic projections of the array substrate 2 and the color filter substrate 3 are overlapped, the bezel area 102 includes a first part 105, which is located in the area in which the orthographic projections of the array substrate 2 and the color filter substrate 3 are overlapped, an edge line s6 of the first part 105 is an unclosed circular arc edge line, and a circle center the unclosed circular arc edge line is in coincidence with a circle center of the circular arc edge line of the display area 101.

In some implementations, the bezel area 102 further includes a second part 106, which is located at the edges, of the array substrate 2 and the color filter substrate 3 which are aligned and combined opposite to each other, on the first side 103, the second part 106 is fan-shaped or inverted trapezoidal, a width g of the second part 106 along the direction away from the display area 101 is greater than a width h of the first part 105 along the direction away from the display area 101.

In some implementations, the width h of the first part 105 is in a range from 1.2 mm to 3.5 mm.

In some implementations, the width h of the first part 105 is about 2.7 mm for the display panel in 3.6 inches.

In some implementations, a width i of the second part 106 along a direction X in which the edges on the first side 103 extend ranges from 8 mm to 15 mm.

In some implementations, the width g of the second part 106 along the direction away from the display area 101 is in a range from 3.0 mm to 5.5 mm.

In some implementations, the width g of the second part 106 along the direction away from the display area 101 is about 5.27 mm for the display panel in 3.6 inches.

In some implementations, for the display panel in 3.6 inches, a maximum distance k between the edge line of the array substrate 2 on the first side 103 and the edge line of the color filter substrate 3 on first side 103 is about 3.26 mm, a minimum distance m between the edge line of the color filter substrate 2 on the first side 103 and the edge line of the display area 101 on the first side 103 is about 2.01 mm.

The peripheral circuit and the peripheral signal lines in the bezel area 102 of the display panel according to the embodiment of the present disclosure are distributed in the same manner as those shown in FIGS. 3a and 3b according to the forgoing embodiment of the present disclosure, and are not repeated. As can be seen from a comparison between the display panel in FIG. 12a and the display panel in FIGS. 3a and 3b, the bezel area 102 of the display panel in FIGS. 3a and 3b is narrower, which can better realize an extremely narrow bezel and a beautiful appearance of the circular or approximately circular display panel.

In the display panel according to the embodiment of the present disclosure, the edge line s1 of the display area 101 is made to be a circular arc edge line, the edge line s2 of the bezel area 102 is made to be a circular arc edge line, a shape of the edge line s1 of the display area 101 is made to be matched with a shape of the edge line s2 of the bezel area 102, the circular or approximately circular display panel can be realized, and the width of the bezel area 102 at each position is the minimum width capable of accommodating the peripheral circuit and the peripheral signal lines distributed at that position, so that on one hand, a sufficient design space of the bezel area 102 of the circular or approximately circular display panel can be ensured, and on the other hand, a narrow bezel of the circular or approximately circular display panel can be realized, thereby the circular or approximately circular display panel can save space to the maximum extent, so that requirements of users can be satisfied, and a beautiful appearance design can ensured simultaneously.

An embodiment of the present disclosure further provides a display device, including the display panel in any of above embodiments.

By adopting the display panel in any embodiment described above, not only a circular or approximately circular display device can be realized, but also a sufficient design space of the bezel area and a narrow bezel of the display device can be realized, so that the display device can save space to the maximum extent, so that the requirements of users can be satisfied and a beautiful appearance design can be ensured simultaneously.

The display device provided by the embodiment of the present disclosure may be any product or member with a display function, such as an LCD panel, an LCD television, an LCD billboard, an OLED panel, an OLED television, an OLED billboard, a display, a mobile phone, a navigator or the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display panel, comprising a display area and a bezel area surrounding the display area,
   an edge line of the display area is an arc edge line, an edge line of the bezel area is an arc edge line, the edge line of the display area is matched with the edge line of the bezel area in shape,
   the display panel comprises a peripheral circuit and peripheral signal lines, the peripheral circuit and the peripheral signal lines are distributed in the bezel area, and the peripheral circuit and the peripheral signal lines are sequentially distributed along a direction away from the display area,
   the display panel further comprises an array substrate and a color filter substrate, and the array substrate and the color filter substrate are aligned and combined opposite to each other to form a cell,
   the array substrate and the color filter substrate are not overlapped at edges thereof on a first side,
   in a portion of the bezel area except another portion of the bezel area where the edges on the first side are located, a distance between the peripheral signal line, closest to an outer edge of the bezel area, and the outer edge of the bezel area is in a range of 0.35±0.2 micrometers,
   the outer edge of the bezel area is an edge of the bezel area away from the display area.

2. The display panel of claim 1, wherein the display area is circular, the display area is located in an area in which orthographic projections of the array substrate and the color filter substrate are overlapped,
   the bezel area comprises a first part located on a second side of the array substrate and the color filter substrate which are aligned and combined opposite to each other, and the second side is opposite to the first side;
   an edge line of the first part is a semicircular arc edge line, and a circle center of the semicircular arc edge line is in coincidence with a circle center of a semicircular arc edge line of the display area on the second side.

3. The display panel of claim 2, wherein the first part comprises a first sub-part and a second sub-part, the first sub-part is located on a side of the display area away from the first side; the second sub-part is divided to be arranged on two opposite side edges of the display area along a second direction,
   the first side and the second side, of the array substrate and the color filter substrate which are aligned and combined opposite to each other, are arranged in a first direction, the second direction is perpendicular to the first direction,
   the peripheral circuit comprises a shift register circuit, and the peripheral signal lines comprise a first signal line connected to the shift register circuit,
   the shift register circuit and the first signal line are not distributed in the first sub-part,
   a part of the shift register circuit and a part of the first signal line are distributed in the second sub-part,
   total distribution widths, at arbitrary positions, of the shift register circuit and the first signal line distributed in the second sub-part are the same.

4. The display panel of claim 3, wherein a width of the first part is in a range from 1.0 mm to 2.7 mm.

5. The display panel of claim 3, wherein the bezel area further comprises a second part and a third part, the second part and the third part are located on the first side of the array substrate and the color filter substrate which are aligned and combined opposite to each other, and the second part and the third part are sequentially arranged along the first direction away from the first part,

the second part is divided to be arranged on the two opposite side edges of the display area along the second direction, the third part is located at an edge of the display area on the first side, the peripheral signal lines further comprise a data line, the data line, a part of the shift register circuit and a part of the first signal line are distributed in the second part and the third part, and the data line and the shift register circuit are sequentially arranged along the direction away from the display area, the total distribution widths, at arbitrary positions, of the shift register circuit and the first signal line distributed in the second part are the same.

6. The display panel of claim 5, wherein a distribution width of the data line in the second part gradually increases from an end of the second part close to the first part to an end of the second part close to the third part.

7. The display panel of claim 6, wherein the distribution width of the data line in the second part and the third part gradually increases from the second part to the third part.

8. The display panel of claim 7, wherein a width of the second part gradually increases along a direction from the second part to the third part.

9. The display panel of claim 8, wherein the width of the second part is in a range from 1.5 mm to 3.2 mm.

10. The display panel of claim 5, wherein the peripheral circuit further comprises a driving circuit, a bonding connection terminal, an electrostatic discharge circuit, and a shielding grounded electrode, the peripheral signal lines further comprise a test signal line group, a common voltage signal line and a shielding signal line, the driving circuit, the bonding connection terminal, the electrostatic discharge circuit, the shielding grounded electrode and the test signal line group are distributed in the third part, the bonding connection terminal and the test signal line group are respectively connected with the driving circuit, the shielding signal line is connected with the shielding grounded electrode and the bonding connection terminal, the common voltage signal line is connected with the shift register circuit and the electrostatic discharge circuit, the shielding signal line and the common voltage signal line each extend from the third part to the second part and the first part respectively, and the shielding signal line and the common voltage signal line respectively loop around the display area, the common voltage signal line is located in an area between the display area and the shift register circuit, the peripheral circuit and other peripheral signal lines distributed in the bezel area are located in an area between the shielding signal line and the display area.

11. The display panel of claim 10, wherein a width of the third part in the second direction gradually decreases in a direction in which the third part is away from the second part.

12. The display panel of claim 11, wherein the bonding connection terminal is located on a side of the driving circuit away from the display area, the data line distributed in the third part is located on a side of the driving circuit close to the display area, the electrostatic discharge circuit is located on two opposite sides of an area, in which the data line is located, along the second direction,

18 the shielding grounded electrode is located on at least one side of the driving circuit along the second direction, and the shielding grounded electrode is located on a side of the shift register circuit away from the display area;

data lines in the third part are distributed in a fan shape or an inverted trapezoid shape, the third part is in a fan shape or an inverted trapezoid shape.

13. The display panel of claim 12, wherein the width of the third part in the second direction is in a range from 10 mm to 12 mm.

14. The display panel of claim 12, wherein the bonding connection terminal comprises a plurality of terminals, and the plurality of terminals are sequentially arranged at intervals along the second direction, a first terminal and a last terminal are grounded, an end of the shielding signal line is connected to the first terminal, extends to be connected to the shielding grounded electrode, and extends from the shielding grounded electrode to loop around an outer side of the shift register circuit away from the display area, another end of the shielding signal line is connected to the last terminal.

15. The display panel of claim 12, wherein the bonding connection terminal comprises a plurality of terminals, and the plurality of terminals are sequentially arranged at intervals along the second direction, a first terminal and a last terminal are grounded, an end of the shielding signal line is connected to the first terminal, extends in the third part to an outer side of the shift register circuit away from display area and an inner side of the shielding grounded electrode close to the display area, the shielding signal line is connected to the shielding grounded electrode, and extends into the second part and the first part to loop around the outer side of the shift register circuit away from the display area, another end of the shielding signal line is connected to the last terminal.

16. The display panel of claim 14, wherein the peripheral circuit and the peripheral signal lines are formed on the array substrate;

the orthographic projection of the color filter substrate on the array substrate is not overlapped with the driving circuit and the bonding connection terminal, an orthographic projection of an edge line, on the first side, of the color filter substrate on the array substrate is located on the array substrate, and is partially overlapped with the shielding grounded electrode, an electrostatic discharge electrode is arranged on a surface of the color filter substrate away from the array substrate, corresponds to the shielding grounded electrode in position, and is connected with the shielding grounded electrode through a conductive adhesive extending to be partially wrapped on an end surface at the edge of the color filter substrate on the first side.

17. The display panel of claim 16, wherein a dimension of the color filter substrate in the first direction is less than a dimension of the array substrate in the first direction, the driving circuit, the bonding connection terminal, the test signal line group, a part of the data line and a part of the shielding grounded electrode are exposed outside the edge line of the color filter substrate on the first side.

18. The display panel of claim 1, wherein the display area is circular, the display area is located in an area in which orthographic projections of the array substrate and the color filter substrate are overlapped, the bezel area comprises a first part located in the area in which the orthographic projections of the array substrate and the color filter substrate are overlapped, an edge line of the first part is an unclosed circular arc edge line, and a circle center of the unclosed circular arc edge line is in coincidence with a circle center of a circular arc edge line of the display area.

19. The display panel of claim 18, wherein the bezel area further comprises a second part located at the edges, on the first side, of the array substrate and the color filter substrate which are aligned and combined opposite to each other, the second part is in a fan shape or an inverted trapezoid shape, a width of the second part in the direction away from the display area is greater than a width of the first part in the direction away from the display area.

20. A display device, comprising the display panel of claim 1.

\* \* \* \* \*